United States Patent [19]

Cislaghi et al.

[11] 4,106,108
[45] Aug. 8, 1978

[54] SEMICONDUCTOR DYNAMIC MEMORY AND RELATED REFRESHING SYSTEM

[75] Inventors: Ezio Cislaghi, Ossona (Mi); Alessandro Scotti, Cornaredo (Mi); Renzo Pederzini, Melegnano (Mi), all of Italy

[73] Assignee: Honeywell Information Systems Italia, Milan, Italy

[21] Appl. No.: 714,177

[22] Filed: Aug. 13, 1976

[30] Foreign Application Priority Data

Aug. 20, 1975 [IT] Italy ............................... 26447 A/75

[51] Int. Cl.² ............................................. G11C 7/00
[52] U.S. Cl. .................................... 365/222; 365/149
[58] Field of Search .... 340/173 DR, 173 R, 173 CA, 340/173 RC

[56] References Cited

U.S. PATENT DOCUMENTS

| | | | |
|---|---|---|---|
| 3,737,879 | 6/1973 | Greene et al. | 340/173 R |
| 3,748,651 | 7/1973 | Mesnik | 340/173 R |
| 3,786,437 | 1/1974 | Croxon | 340/173 DR |
| 3,800,295 | 3/1974 | Anderson et al. | 340/173 R |

Primary Examiner—Terrell W. Fears

[57] ABSTRACT

A semiconductor memory is provided with means for refreshing the memory. Interrupt requests generated by the memory initiate refreshing cycles, which take place in parallel with normal read/write memory operations. The memory is divided in two parts or blocks. If the central processor unit assigns a cycle for read/write operation to one of the two blocks, the same cycle is utilized to recharge or refresh a row of storage elements of the integrated units which constitute the other block of the memory. Refreshing is regulated by low priority interrupt requests and, if not responded to, by high priority interrupt requests, which are mandatory.

7 Claims, 7 Drawing Figures

SEMICONDUCTOR DYNAMIC MEMORY AND RELATED REFRESHING SYSTEM

BACKGROUND OF THE INVENTION

The present invention relates to a system for ensuring regular information "refreshing" of the storage elements of a semiconductor read-write memory in electronic binary data processing apparatus. In recent times semiconductor dynamic memories are commonly employed as the main memories in data processing apparatus. However, these memories are intrinsically volatile, that is the registered information fades out with the passing of time and may become completely lost. Therefore, these memories must be refreshed periodically and it is necessary to assure that the refreshing operation is carried out within a defined time interval.

A copending patent application entitled "Information Refreshing System in a Semiconductor Memory," filed Dec. 23, 1974, Ser. No. 535,267, which is assigned to the assignee of the present application, describes a refreshing system in which the storage elements of each integrated unit that constitute the main memory are organized in rows and columns of integrated units.

Each row of all the integrated units is subjected to refreshing cycles suitably and uniformly distributed in a convenient time interval and inserted in periods of normal operation of the data processing system. According to the above system, at fixed time intervals a memory cycle is utilized only for the refreshing of a row of all the integrated units and it is unavailable, i.e., "lost," for accomplishing the normal processing operations. If the number of the rows of the integrated units utilized is low and the frequency required for the memory refreshing cycles is therefore not too high, the refreshing system described in the above mentioned patent application operates well. However, with integrated units characterized by a large number of rows, the frequency of the refreshing cycles becomes unacceptable from a system point of view.

SUMMARY OF THE INVENTION

The present invention obviates these shortcomings by providing a new refreshing system for a memory characterized by integrated units with a large number of rows, which makes use of refreshing cycles in parallel with the normal read-write memory operation. Thus, the refreshing cycles remain available for the normal processing operations.

In accordance with the invention, the memory is divided in two parts or blocks A and B. If the central processor unit assigns a cycle for read-write operation to one of the two blocks, the same cycle is utilized to recharge or refresh a row of storage elements of the integrated units which constitute the other block of the memory.

Two counters are associated with each block which control the recharging operations: A refreshing counter which delivers the address of the row of the storage elements to be recharged; and a refreshing cycle accumulator which memorizes the recharging state of the block as a function of the time elapsed between subsequent recharges. The refreshing cycle accumulator is incremented by one unit at a suitable fixed frequency which corresponds to a pre-established time interval. Further, it is decremented by one unit each time that a row of storage elements is recharged or refreshed.

An interrupt request with a low priority level for memory refreshing is sent to the central processor unit only when one of the two cycle accumulators reaches a pre-established configuration, that is when the cycle accumulator has been incremented several times without the occurrence of any refreshing cycles to decrement it.

An interrupt request with a high priority level (emergency for memory refresh), is sent to the central processor unit if the refresh command, due to the low priority interrupt signal, was not received by the memory within a pre-established time interval. In such a case it is mandatory to perform the refreshing operation immediately by blocking all other ongoing activities.

An interrupt request with a high priority level is also generated when the cycle accumulator reaches a configuration which indicates that a delay has been accumulated such that a time recovery is required. This situation may occur even though the operation of memory refreshing has taken place as a result of more low priority level interrupt requests performed within time intervals each of which is lower than the one which causes the generation of a high priority level interrupt request. If, however, during the subsequent execution of the refreshing operations the aforesaid delay accumulates, a refresh operation becomes mandatory.

OBJECTS OF THE INVENTION

It is a primary object of the present invention to provide a new and improved memory which is not subject to the disadvantages of prior art memories of this type.

It is another object of the present invention to provide a new and improved memory having volatile information storage wherein refreshing is carried out for a large number of rows of storage elements without loss of the stored information and without materially degrading memory performance.

It is a further object of the present invention to provide a new and improved semiconductor memory wherein the refreshing of volatile information stored in one portion of the memory occurs in accordance with assigned priority levels in the same cycle during which read/write operations are carried out in another memory portion.

These and other objects of the present invention together with the features and advantages thereof will become apparent from the following detailed specification when considered in conjunction with the accompanying drawings.

DETAILED DESCRIPTION OF THE PREFERRED EMBODIMENT

Figure 1:
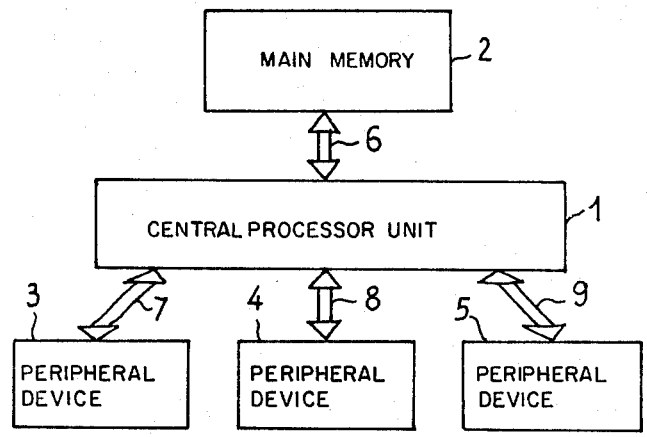
FIG. 1 is a schematic diagram of a data processing system.

FIG. 1 is a schematic diagram of the organization and of the elements which constitute a data processing system. The system consits of a central processor unit 1, a main memory 2 and a plurality of peripheral devices 3, 4, 5, such as printers, readers, card punches etc. The main memory 2 and the peripherals are connected to the central processor unit be means of sets of wires 6, 7, 8, 9, each of which sets is called interface.

The information exchange between the main memory, peripheral apparatus and the central processor unit takes place through said interface. When the peripheral units want to communicate with or to get information from the main memory, they forward interrupt requests to the central processor unit. These requests are recognized and honored according to pre-established priority criteria with regard to the degree of urgency characterizing each of them. From this point of view also the semiconductor memory acts as a peripheral. In fact, each time refreshing is required, the memory forwards an interrupt request to the central processor unit in order to obtain from it suitable refreshing instructions.

The refreshing interrupt requests generated by the memory have a pre-established hierarchic level, or priority level, if compared to the requests generated by the other peripherals. In particular, in the refreshing system here described and in the semiconductor memory to which it refers, it is foreseen that the memory can generate two different types of interrupt requests: a low priority level request that can be temporarily ignored if, at the same time, other peripherals generate interrupt requests with a higher priority level, (or they have some operation running with the central processor unit in consequency of interrupt requests of a high priority level); and a high priority level request compliance with which is mandatory and which prevails over any other interrupt request. The high priority level request interrupts the execution of any operation which is running on the central processor unit at the end of the machine cycle during which the interruption was shown to occur.

The elements which constitute a data processing system are very well known to those skilled in the art and are therefore not described in detail herein. To facilitate an understanding of the present invention and of the relations existing between the main memory and the central processor unit, it is considered sufficient to provide an outline only of the interface which connects the central processor unit with the semiconductor memory.

Figure 2:
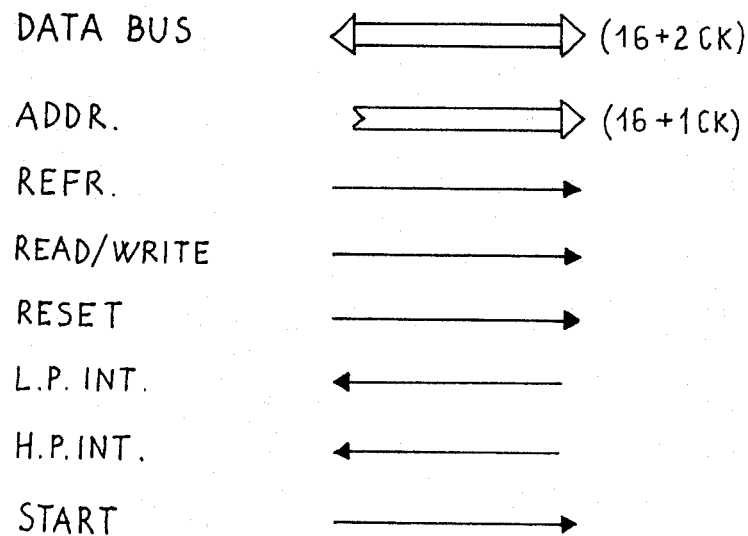
FIG. 2 is a simplified diagram of a communication interface between the elements of a data processing system.

With reference to the preferred embodiment here described, FIG. 2 shows the interface wires which connect the central processor unit with the memory. A plurality of wires, 18 in number and designated DATA BUS, is used to transfer in bidirectional mode binary data consisting of 16 bits, i.e., 2 bytes plus two parity check bits (2 ck). These wires are used to transfer the information to be written into the memory or to be read from the memory. A plurality of wires, 17 in number and designated ADDR, is used to transfer the memory addresses from the central processor unit to the semiconductor memory. The latter addresses are coded in binary form and consist of 16 bits plus one parity check bit. It is therefore possible to address about 64,000 different memory positions.

A wire designated REFR is used to forward a refreshing command from central processor unit to the memory unit. A wire designated READ/WRITE is used to specify, according to the logic level present on it, if the operation to be carried out is a read operation or a write operation. A wire designated RESET is used to put the logic circuits, the registers and the counters contained in the memory unit into a known state.

A wire designated LP INT is used to transfer an interrupt request for a low priority level refreshing from the memory to the central processor unit. A wire designated HP INT is used to transfer an interrupt request for a high priority level refreshing from the memory to the central processor unit. A wire designated START is used to transfer a command signal synchronized with the central processor unit, from the central processor unit to the memory units to initiate a memory cycle as specified by the READ/WRITE wire (or by the REFR. wire).

A description of the physical memory organization has been omitted here since it is not considered essential for an understanding of the invention. It should be noted that the memory consists of modules in order to obtain variable memory capacity, for example, for a minimum of 8000 words of 2 bytes each, to a maximum of 64,000 words of 2 bytes each.

Figure 3:
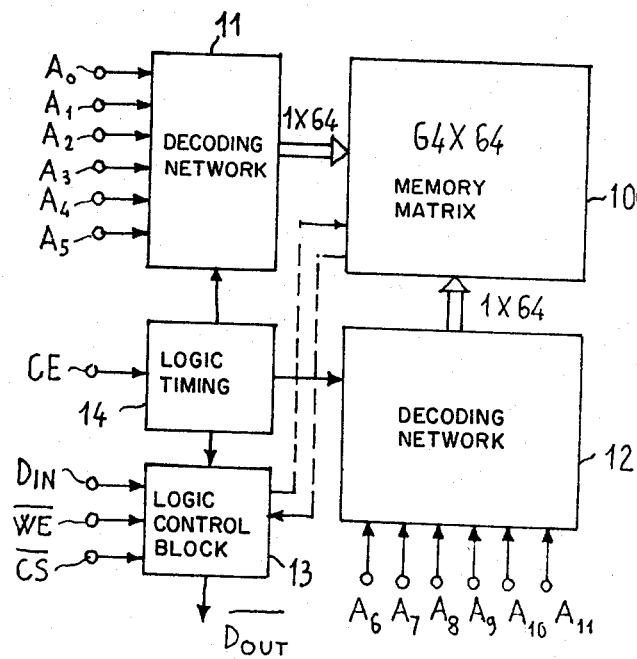
FIG. 3 is a schematic diagram of an integrated semiconductor memory unit.
Figure 4:
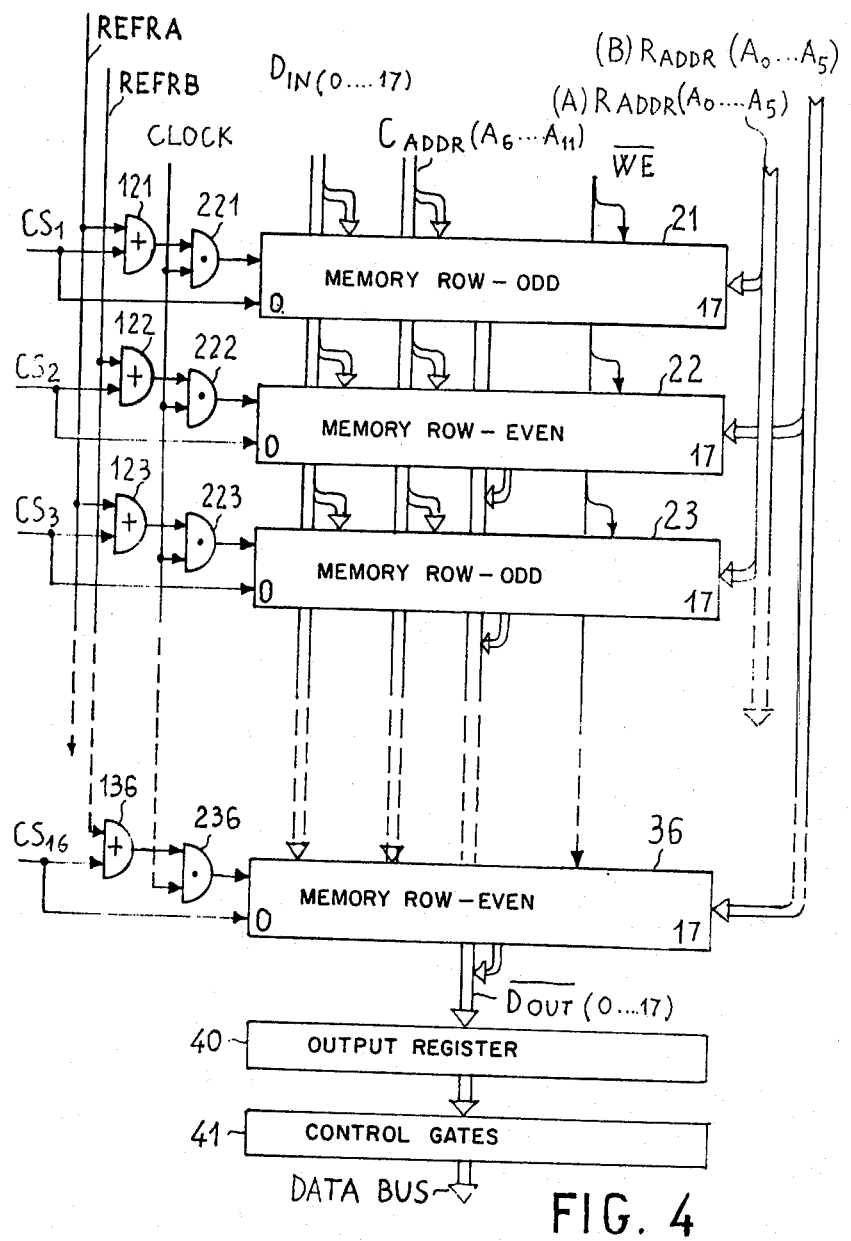
FIG. 4 is a schematic diagram of a memory circuit organization according to the invention.

Reference is now made to FIGS. 3 and 4, which illustrate the logical arrangement of the memory organization.

FIG. 3 is a schematical block diagram of an integrated semiconductor memory unit, for example of the type marketed by INTEL Corporation, and commercially available as item number 2107 A. This is a MOS memory provided with timing, controlling and decoding circuits. The integrated unit consists of a matrix of 64 X 64 memory cells 10. Each memory cell is addressed by means of a row selection accomplished by a row decoding network 11, provided with six input terminals $A_0 \ldots A_5$ and 64 outputs, and a column selection accomplished by a column decoding network 12, provided with 6 input terminals $A_6 \ldots A_{11}$ and 64 outputs.

The operations performed on the matrix are defined by a logic control block 13. Block 13 is provided with an input terminal $D_{IN}$ to write an information bit on the addressed memory cell; an output terminal $\overline{D_{OUT}}$ to transfer an information bit fetched from the addressed memory cell to the outside in complemented form; an input terminal $\overline{WE}$ (which corresponds to the interface signal READ/WRITE) to define, according to the logic level present, if the operation is a WRITE operation or a READ operation; and an input selection terminal $\overline{CS}$ to enable or inhibit both the input terminal $D_{IN}$ and the output $\overline{D_{OUT}}$ terminal of the integrated circuit. The activation of the integrated unit is controlled by means of a logic timing and controlling block circuit 14, provided with an input terminal CE, to which an enabling and timing signal of the unit is applied. Inasmuch as they are well known to those skilled in the art, such elements as the power supply terminals, etc. are not illustrated in FIG. 3.

The main characteristic of the integrated unit described is that for any operation performed on one memory cell of the unit, the operation causes the recharge of all the memory cells of the unit which belong to the same row. In addition, if no signal is applied to the selection terminal $\overline{CS}$, the activation of the integrated unit (by applying a signal to the input terminal CE) causes the recharge of one row of the unit, namely of the row addressed by the code present on the input terminals $A_0 \ldots A_5$, without involving the input terminal $D_{IN}$ and the output terminal $\overline{D_{OUT}}$.

For further details of the structure and the operating mode of an integrated memory unit of the type described, reference is made to the technical brochures of the manufactures of such units as well as to the aforesaid U.S. patent application Ser. No. 535,267.

FIG. 4 shows how the integrated units of FIG. 3 are organized. From the functional and circuit point of view, the integrated units are organized in rows of 18 units each. For a memory with a capacity equal to 64 words 16 rows are employed. The 16 rows are grouped in two blocks containing the same number of rows. For example, the rows 21, 23 ... and all the odd rows constitute a memory block (A); rows 22 ... 36, that is all the even rows, constitute a memory block (B).

An addressing code of 6 bits on the wires (A) $R_{ADDR}$ $A_0 \ldots A_5$ simultaneously addresses the same row of memory cells inside of all the integrated units which constitute block (A). Similarly, the 6 bit addressing code on the wires (B) $R_{ADDR} A_0 \ldots A_5$ simultaneously addresses the same row of memory cells inside of all the integrated units which constitute the block (B).

It is clear that the wires (A) $R_{RADDR} A_0 \ldots A_5$ and (B) $R_{RADDR} A_0 \ldots A_5$ are connected to the terminals $A_0 \ldots A_5$ of all the integrated units which belong respectively to block (A) and block (B). Similarly, an addressing code of 6 bits on the wires $C_{ADDR} A_6 \ldots A_{11}$ addresses simultaneously the same column of memory cells inside of all the integrated units which constitute the memory.

Sixteen different wires $CS_1, CS_2 \ldots CS_{16}$ are provided for the emission of as many selection signals, each of them connected respectively to all the integrated units of one row. Each wire is capable of the selection of all the integrated units which belong to the same row. Each of the 16 wires CS is also connected to an input terminal of a two-input OR gate 121, 122, 123 ... 136.

A wire designated REFR. A is connected to the second input terminal of the OR gates 121 ... 135, i.e. to all the odd OR gates. This wire transfers a recharge command (REFRA) derived from the control recharge network as will be seen below. A wire designated REFR B is connected to the second input terminal of the OR gates 122 ... 136, i.e. it is connected to all the even OR gates. This wire transfers a recharge command (REFR B), derived from the control recharge network, as will be seen hereinafter.

The output terminals of the OR gates 121, 122 ... 136 are connected to one input terminal of a corresponding number of AND gates 221, 222 ... 236, which are enabled by a common timing signal CLOCK applied to the second input terminal of these AND gates. Such a signal is derived from a timing network that will be considered later on. The output terminals of the AND gates are connected respectively to the input terminals $CE_1, CE_2 \ldots CE_{1b}$ of the 16 rows of the memory integrated units and they supply to said rows the enabling signal $CE_i$.

The combined use of a selection or addressing code with 12 bits, (for the selection of rows and columns), of an enabling and timing signal on the wire $CE_i$, and of a selection signal on the wire $CS_i$, allows the addressing of a word of 18 bits, said bits being contained each in a well defined memory cell of the integrated units which constitute the row $i$.

The operation performed on the memory is defined by a read-write command applied to the wire $\overline{WE}$ which is connected to the terminal $\overline{WE}$ of all the integrated units which constitute either the block (A) or the block (B). Data to be written into the memory, in binary code of 18 bits, is applied to the wires $D_{IN}(0 \ldots 17)$, each of which is connected to all the terminals $D_{IN}$ of the integrated units of the same order belonging to different rows. Similarly, the output terminals of each memory unit, $\overline{D_{OUT}}$ are grouped for the two blocks (A) and (B) in the collector channel of the 18 wires $\overline{D_{OUT}}(0 \ldots 17)$. From the collector channel $\overline{D_{OUT}}(0 \ldots 17)$, the information read out is temporarily memorized in the output register 40, to be then transferred on the interface channel DATA BUS, through a group of control gates 41. In addition, due to the presence of REFR A or REFR B command, all the integrated units of a block are enabled for the execution of a recharge operation.

Figure 5:
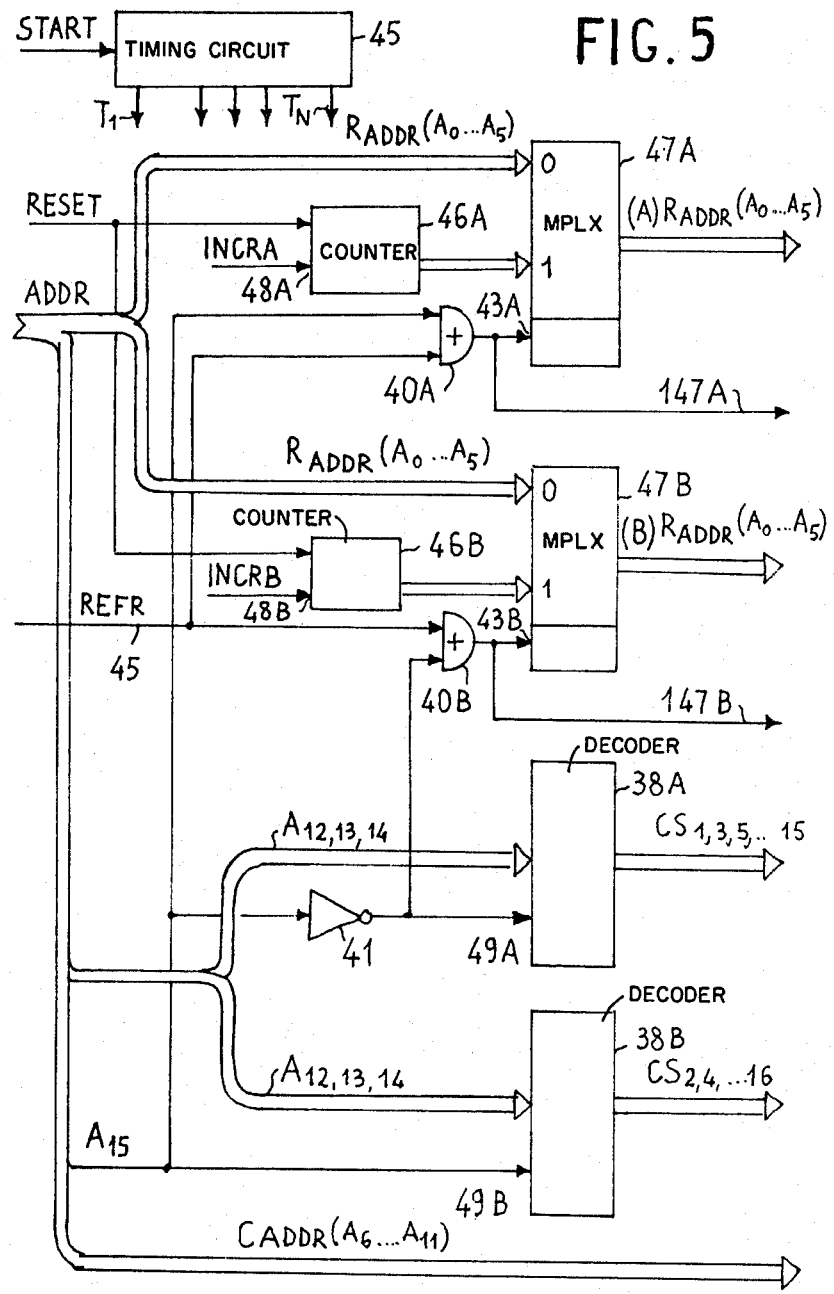
FIG. 5 is a diagram of the selection and addressing circuits of a memory organized according to the invention.

FIG. 5 shows the memory selection circuits for the execution of read-write and/or memory recharge operations. The START signal, coming from the central processor unit through the interface each time that it is necessary to initiate a memory cycle, activates the timing circuit 45. The latter consist of a delay line with intermediate taps $T_1 \ldots T_N$, suitably adjusted in such a way as to generate a sequence of timing pulses on said taps.

For reason of simplicity, the timing pulses, when not indicated otherwise, will be designated with the same name of the wires which transfer them and mention will be made of those pulses which are necessary for an understanding of the invention. In particular, with reference to FIG. 4, the CLOCK pulse has already been mentioned.

The different timing signals are transferred to different locations of the memory where they command the enabling of determined AND gates. In addition, the memory receives from the central processor unit the 17 wires ADDR for the emission in coded form of the memory addresses. The signals present on said wires are first of all verified in a verifying network and then used for the addressing.

A set of six wires of the 16 wires actually used for the addressing code, is connected to all the integrated units. They constitute the column addressing wires $C_{ADDR} A_6 \ldots A_{11}$, as already seen in FIG. 4.

Another set of 6 wires, designated $R_{ADDR} (A_0 \ldots A_5)$ is connected to the input terminals designated "0" of two integrated multiplexer circuits, indicated respectively 47A and 47B. Multiplexer circuits, as they are known, are provided with a plurality of input groups, an output group and one or more control inputs. Depending on the logic level present at the control inputs, one of the different input groups is connected to the outputs in such a way that the signals present on the selected input group are transferred to the outputs.

The multiplexer circuits 47A and 47B shown in FIG. 5 are provided with two input groups, designated respectively "0" and "1", and with one control input designated respectively 43A and 43B. When the logic level present at the control input "0" is selected, the signals present on the inputs designated "0" are transferred to the outputs. When the logic level present at the control input "1" is selected, the signals present on the inputs designated "1" are transferred to the outputs.

The outputs of the multiplexers 47A and 47B, designated with (A) $R_{ADDR} A_0 \ldots A_5$ and (B) $R_{ADDR} A_0 \ldots A_5$ provide, as already seen in FIG. 4, the addressing of a well defined row of cells inside of all the integrated units of each block (A) and (B).

Of the 16 addressing wires ADDR, the three wires $A_{12}$, $A_{13}$, $A_{14}$ are coupled to two decoding networks 38A and 38B, which decode the 3 bit binary code present on those wires to generate a corresponding signal on only one of the 8 output wires. The aforesaid wires are designated CS 1, 3, 5, 7, 9, 11, 13, 15 with regard to the decoding network 38A; and CS 2, 4, 6, 8, 10, 12, 14, 16 with regard to the decoding network 38B.

As already seen in FIG. 4 and FIG. 3, a signal present on these wires selects a row of the integrated units of said memory and enables the input terminal $D_{IN}$ and the output terminal $\overline{D_{OUT}}$ of said units.

The addressing wire A 15, depending on whether the signal present on it is at logic level "0" or "1," enables the multiplexer circuit 47A or 47B and the decoding circuit 38A or 38B respectively. More precisely, the wire A 15 is connected directly to the enabling input 49B of the decoding circuit 38B and in addition it is connected to the selection input 43A of the multiplexer circuit 47A through the OR gate with the two inputs 40A. Further, it is connected to the enabling input 49A of the decoding circuit 38A through the inverter circuit 41 and, still through the inverter circuit 41 and the OR gate 40B, it is connected to the selection input 43B of the multiplexer circuit 47B. The second input terminal of the two OR circuits 40A and 40B is also connected to the wire 45 to which the recharging command REFR. coming from the central processor unit is applied.

To complete the description of FIG. 5, it is pointed out that the two input groups designated "1" respectively in the multiplexer circuits 47A and 47B, are connected to the output terminals of the counters 46A and 46B respectively. The counters 46A and 46B, consisting of six stages, are able to count from 0 up-to 63 and they provide at their output terminals a 6-bit row address. The latter is used to address a row of each one of the memory integrated units in the block (A) or in the block (B) alternatively to the $R_{ADDR}$ ($A_0 \ldots A_5$) code received through the interface.

The counters 46A and 46B are of the cyclical type. Specifically, once they reach the configuration corresponding to 63, they restart the count from zero. Their configuration is increased by one unit each time they receive a command pulse INCR A and INCR B at the input terminals 48A and 48B respectively. The aforesaid command pulses are generated by the recharging control network that will be shown later.

The memory selection circuits forward recharging signals to the control network through the wires 147A and 147B. The wires are connected respectively to the OR gates 40A and 40B. Therefore, a signal on the wires is present at logic level "1":

(a) On both wires when the central processor unit emits a REFRESH command.

(b) On wire 147A when the central processor unit emits a memory selection code relative to the block B, such that the logic level present on the wire A 15 is "1."

(c) On wire 147B when the central processor unit emits a memory selection code relative to the block A, such that the logic level present on the wire A15 is "0."

Figure 6:
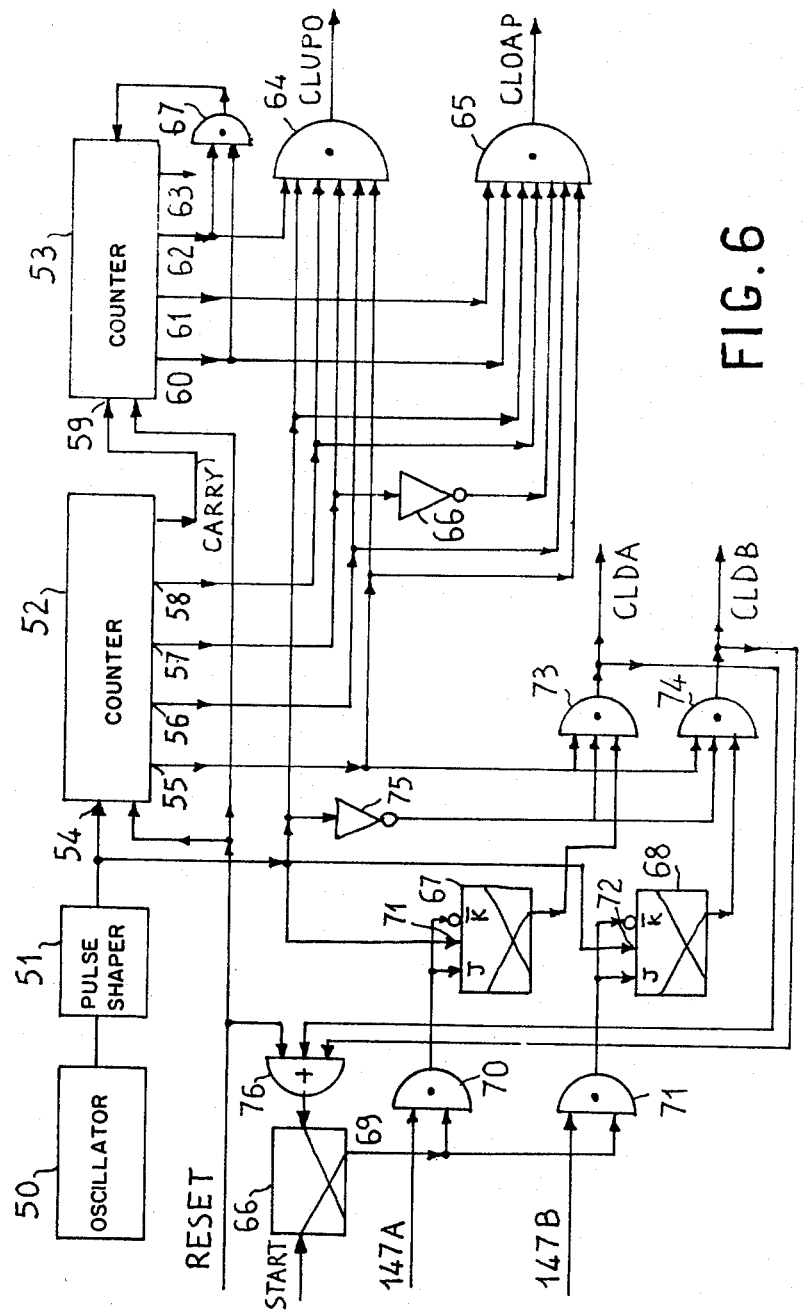
FIGS. 6 and 7 both illustrate schematic diagrams of a preferred embodiment of the memory logic circuitry devoted to refreshing operations.
Figure 7:
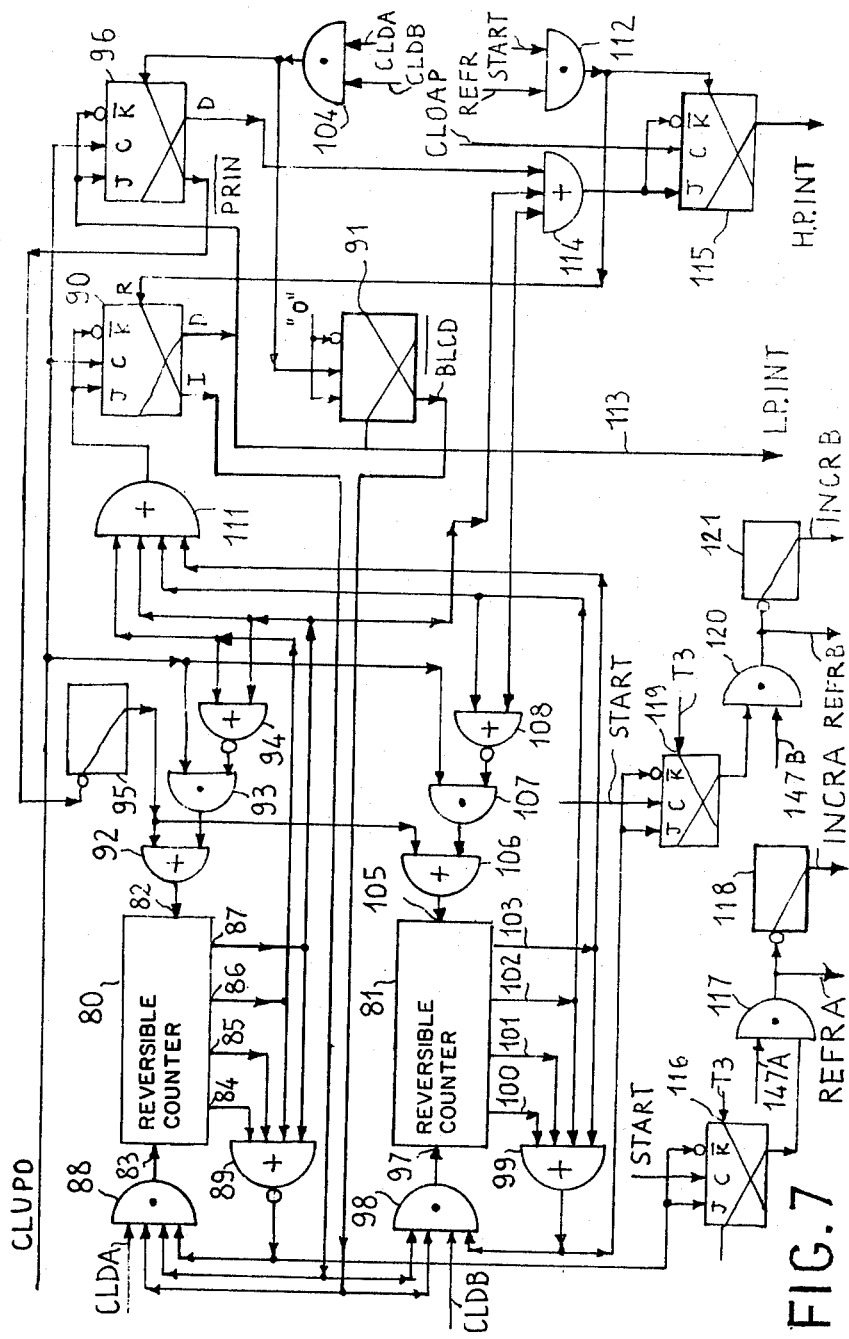

FIGS. 6 and 7 jointly show the memory logic that provides the control of the recharging operations. In particular, FIG. 6 shows that part of the logic which can be defined as the internal memory clock. It should be noted that, to prevent the loss of information, each integrated memory unit has to be recharged entirely within a pre-established time interval, e.g. within two milliseconds. For reasons of safety the available average recharge time interval is assumed to be much smaller, for instance one millisecond. Since recharging takes place row by row, it is necessary for a 64-row integrated memory unit that recharging be performed each 16 $\mu$sec measured from the instant in which the memory starts to operate independently from the timing and from the operations carried out by the central processor unit. An internal clock notes the time elapsed and the consequent necessity of recharging the memory. This clock is activated by power supplying the memory and it runs in a fully autonomous manner with respect to the central processor unit operation.

In a preferred embodiment of the invention, as illustrated in FIG. 6, an oscillator 50 generates a 5 MHZ signal. A pulse shaper 51 is connected to the output terminal of the oscillator. A binary counter, consisting, for example, of two 4-bit integrated counter circuits 52 and 53, has an input 54 connected to the output of the pulse shaper 51. Input 54 is adapted to trigger the counter with a sequence of pulses, each having a pulse duration of 100 nsec, and with a period of 200 nsec.

The counter 52 is reset at the beginning of the operation by a RESET signal (for instance that shown in FIG. 2). Later it evolves at each pulse and it presents, at its output terminals 55, 56, 57, 58, a logical binary configuration which goes from 0000 to 1111. After the first 15 pulses, upon the occurrence of the 16$^{th}$ pulse, i.e., after 3.2 $\mu$sec. from the beginning of operation, the counter returns to the configuration 0000 and then again starts to evolve.

At the same time a carry pulse is transferred from the carry output CARRY to the input 59 of the counter 53, equal to the counter 52. Also, the counter 53, (being at the beginning in reset state), evolves due to said pulse and to subsequent carry pulses, so that its outputs 60, 61, 62 have a configuration that advances starting from 0000.

The outputs 60 and 62 are connected to the inputs of an AND circuit, the output of which is connected to a reset input of the counter 53. Therefore, when the configuration reaches the value 0101 (corresponding to 5) at the outputs 60, 61, 62, 63, the counter 53 is reset.

The counter 53 operates as a cyclic counter with a period equal to 5. The outputs 55, 56, 57, 58, 62, together with the output of the pulse shaper 51, are connected directly to as many inputs of an AND gate 64. The output of the later goes to logic level "1" each time the configuration "all one" is present at its inputs, i.e., every 16 $\mu$sec. (and after 15.2 $\mu$sec. from the starting instant.

The pulse duration at the output of the AND gate 64 is obviously 100 $\mu$sec. The aforesaid pulse is designated CLUPO (CLOCK-UP), since, as will be seen below, it must activate the forward counting of two counters. The latter indicate the recharging state, being contained in the recharge logic.

The outputs 55, 56, 58, 60, 61 and the output of the pulse shaper 51 are also connected directly to as many inputs of an AND gate 65. Further, the output 57 is connected to an input of the AND gate 65 through an inverter circuit 66. The output of the AND gate 65 goes therefore to a logic level "1," with a duration of 100 nsec. However, these output pulses are in advance of 4 $\mu$sec. with respect to the output pulses of the AND gate 64.

The output pulses of the AND gate 65 are designated CLOAP and they are used, as we will see, for the timing of the generation of the high priority level interrupt request for a memory refresh. A group of flip-flops 66, 67, 68 is used for suitably synchronizing with the internal memory clock, signals asynchronous with respect to the clock. The START command, (interface signal, FIG. 2), is generated in an asynchronous way with respect to the internal memory clock and it depends only from the central processor unit timing. It is generated each time the central processor unit is willing to initiate a read-write operation or a recharge operation. Also, the signals on the wires 147A and 147B (FIG. 5), which represent recharge commands relative to block A or block B of the memory, are generated asynchronously following addressing or REFRESH signals.

The START signal is applied to the set input of the flip-flop latch 66, putting it on the set state. The direct output 69 of the flip-flop 66 is connected to the enabling input of the two AND gates 70, 71, the second input of which is connected to the wires 147A and 147B respectively. By the occurrence of a REFRESH command or a read-write command both the wires, or only one of the two, convey a signal at logic level "1" which is transferred to the output. The outputs of the gate circuits 70 and 71 are connected respectively to the J and K inputs of the two J-K flip-flops 67 and 68. The clock input 71A and 72 of said flip-flop is connected to the output of the pulse shaper 51.

As soon as a pulse is received on the clock input, if the output of the AND gate 70 is at logic level "1," the flip-flop 67 is put in the set state. For the opposite situation, it is maintained or reset to the reset state.

Similarly, as soon as a pulse is received on the clock input, if the output of the AND gate 71 is at logic level "1," the flip-flop 68 is set to the set state; in the opposite case it is maintained or reset to the reset state.

The direct outputs of the flip-flops 67 and 68 are connected respectively to one input each of the AND gate circuits 73 and 74. The second input of each of said AND circuits is connected to the output 55 of the counter 52 and a third input is connected to the output of the pulse shaper 51 through an inverter circuit 75.

It will be clear that the outputs of the AND gate circuits 73 and 74 go respectively to logic level "1" only if the flip-flops 67 and 68 are respectively in the set state and the output of the pulse shaper 51 is at logic level "0" and the output 55 at logic level "1," that is for a duration of 100 nsec. The output pulses of the AND gates 73 and 74 are therefore out of phase and are not superimposed on the output pulses of the AND gates 64 and 65.

The output pulses of the AND circuits 73 and 74 are named respectively OLDA and CLDB, (CLOCK DOWN A and CLOCK DOWN B), since, as will be seen hereinbelow, their function is to activate the decrementing of two counters which indicate the recharge state and which are located in the recharge logic.

The output of the AND gate circuits 73 and 74 are connected to the inputs of an OR gate 76, the output of which is connected to the reset input of the flip-flop 66. Therefore, as soon as a pulse CLDA or CLDB is emitted, the flip-flop 66 is put in the reset state. Further, the flip-flops 67 and 68 are put in the reset state by the subsequent clock pulse of the pulse shaper 51. Thus, the generation of additional pulses CLDA or CLDB is inhibited up to the occurrence of new START pulse. FIG. 7 shows the recharge logic circuitry, which consists mainly of two counters or recharge buffers 80 and 81. The function of the latter is to memorize the recharge state of the two memory blocks A and B.

In the preferred embodiment of the invention described herein, the two binary counters consists of four stages and are reversible, i.e., they can be incremented by decremented depending on whether the command pulses are applied to an incrementing input or to a decrementing input. The counter 80 is supplied with an incrementing input 82, a decrementing input 83 and suitable preset inputs and preset commands, not shown. In addition, it is supplied with four outputs of binary weight, respectively 84, 85, 86 and 87.

The CLDA pulses coming from the internal clock (FIG. 6) are applied to the decrementing input 83 through the four inputs of AND circuit 88.

In order to transfer the CLDA pulses to the input 83, the following conditions must be satisfied:

(a) The counter 80 must not be in the configuration 0000 — Such a condition is forced by connecting the outputs 84, 85, 86, 87 to corresponding number of inputs of an OR circuit 89 and by connecting the output of said OR gate to an input of the AND circuit 88.

(2) When an interrupt request for the refreshing operation is running, recharge operations on a memory block, if any follow read-write operations on the other block, must not modify the state of the counter, i.e., they must be ignored. In other words, it follows from the criteria that an interrupt request must be specifically satisfied by the central processor unit with a refreshing command. Such a condition is forced by connecting to one input of the AND gate 88 the complemented output of a flip-flop 90. The latter is used to generate the low priority level signal LPINT and its complement $\overline{\text{LPINT}}$. In such a way, when the flip-flop 90 is in the set state, the AND circuit 88 is inhibited.

(3) The CLDA pulses, following recharge operations caused by recharge interrupts, must not modify the counter state and must be ignored.

Such a condition is forced by connecting the complemented output of the flip-flop 91 to one input of the AND circuit 88, such output being used to generate an inhibiting signal BLCD. The latter signal originates with an interrupt request and keeps up to the falling edge of the CLDA pulse following the refreshing operation caused by said interrupt request. The pulses CLUPO coming from the internal clock (FIG. 6) are applied to the incrementing input 82 through the OR circuit 92 and the AND circuit 93.

In order to transfer the CLUPO pulses through the AND circuit 93, the condition that the output 86 or the output 87 are not at logic level "1" must be verified. In other words, the counter 80 can be incremented to reach the output logic configuration 0100. However, when this configuration or subsequent ones are reached, the CLUPO pulses no longer have any effect. At this point the outputs of the counter with higher weight 86 and 87 are connected to the two inputs of the NOR circuit 94, the output of which is connected to the enabling input of the AND circuit 93.

Further incrementing of the counter is made possible by the univibrator 95, the output of which is connected to a second input of the OR circuit 92. The univibrator 95 is activated by the falling edge of the signal $\overline{\text{PRIN}}$ generated by a flip-flop 96, the function of which will be explained below. The structure of counter 81 and of the circuits associated with it is similar. The CLDE pulses received from the internal clock (FIG. 6) through the AND gate 98, are applied to the decrementing input 97 of the counter 81.

The AND gate 98, having the same function as the AND gate 88, is controlled as follows:
(1) By the output of the OR circuit 99, (equal to the OR circuit 89), the inputs of which are connected to the outputs 100, 101, 102, 103 of the counter 81;
(2) By the complemented output of the flip-flop 90, used for transferring the inhibiting signal $\overline{BLOD}$.

The CLUPO pulses coming from the internal clock (FIG. 6) are applied, through the OR circuit 106 and the circuit AND 107, to the incrementing input 105. In similar manner to the AND gate 93, the AND gate 107 is conditioned by the output signal of the NOR circuit 108. The inputs of the latter are connected to the outputs 102 and 103 (higher weight outputs) of the counter 81. Therefore, the counter 81 can also be incremented by the pulses CLUPO until it reaches the output configuration 0100. Additional increments are possible due to the pulses generated by the univibrator 95 and applied to the counter 81 through a second input of the OR circuit 106.

The part of the refresh logic circuitry which is intended for the generation of the refresh interrupt signals will now be described. The two outputs of the counters 80 and 81 having higher weight, i.e., the outputs 86, 87 and 102, 103 are connected to the input of the OR circuit 111. The output of the circuit 111 is connected to the input J and $\overline{K}$ of the flip-flop J - K 90 mentioned above.

The pulses CLUPO are applied to the clock input C of the aforesaid flip-flop. Therefore, when the falling edge of the pulses CLUPO appears, flip-flop 90 is set or reset, depending on whether the output of the OR gate 111 is at logic level "1" or "0." Flip-flop 90 is also supplied with a direct reset input R, connected to the output of the AND circuit 112. The signals REFR (Refresh command) and START are applied to the inputs of circuit AND 112. Therefore, when the central processor unit commands a refreshing operation, the flip-flop 90 is reset.

The direct output D of the flip-flop 90 sends, on the wire 13 and through the memory interface, a low priority level interrupt signal LPINT to the central processor unit in order to request a recharge operation. In addition, through a direct set input, it sets the flip-flop 91. However, the complemented output of the flip-flop 90, when it is at logic level "0," inhibits the AND circuits 88 and 98. The direct output D of the flip-flop 90 is also connected to the inputs J and $\overline{K}$ of the J - K flip-flop 96.

The pulses CLUPO are applied at the clock input C of the aforesaid flip-flop. Therefore, when the pulses CLUPO fall, the flip-flop 96 is set or reset depending on the state of the flip-flop 90. The flip-flop 96 is provided with a direct reset input to which the output of the AND circuit 104 is connected. The pulses CLDA and CLDB are applied to the inputs of the AND circuit 104. Therefore, when a refreshing operation is commanded by the central processor unit and, (with a same delay), the pulses CLDA and CLDB are consequently generated, flip-flop 90 is reset. The direct output of the flip-flop 96 sends a signal PRIN through wire 109 to OR circuit 114 to prepare the high priority level interrupt request.

The complemented output I of flip-flop 96 couples the signal $\overline{PRIN}$ to the clock input of the univibrator 95.

As soon as the flip-flop 96 is set, the falling edge of the signal $\overline{PRIN}$ activates the univibrator 96.

In addition to the signal PRIN from the flip-flop 96, the OR circuit 114 receives at its input the signals having higher weight which are present at the outputs 87 and 103 of the two counters 80 and 81. Therefore, the output of the OR circuit 114 goes to logic level "1," when any of the following conditions is verified:
(1) The flip-flop 96 is in the set state.
(2) The counter 80 reaches the configuration 1000.
(3) The counter 81 reaches the configuration 1000.

The output of the OR circuit 114 is connected to the inputs J and $\overline{K}$ of a J - K flip-flop 115. The latter flip-flop is activated through the clock input C by the pulse CLOAP received from the internal clock. Therefore, if the output of the OR gate 114 is at logic level "1," when the falling edge of the pulse CLOAP occurs the flip-flop 115 is set and generates a high priority level interrupt signal HP INT. The latter is transferred through the interface to the central processor unit.

The flip-flop 115 is provided with a direct reset input, connected to the output of the AND circuit 112. Therefore, flip-flop 116 assumes the reset state when both the REFR command and the START pulse are simultaneously present.

It will be noted that clock input C of flip-flop 291 is connected to the output of AND circuit 104, while the inputs J and $\overline{K}$ are always connected to the logic level "0." Therefore, when the falling edge of pulses CLDA and CLDB are applied to the inputs of AND circuit 104, flip-flop 91 will reset.

The recharge logic is completed by means of auxiliary circuits. Specifically, the output of OR circuit 89, besides being connected to gate 88, is connected to the inputs J and K of a J - K flip-flop 116. The latter flip-flop is activated through the clock input C by means of a timing pulse START emitted by the timing network (FIG. 5). It is reset by a timing pulse T3 (emitted by the network 45). The direct output of the aforesaid flip-flop enables the AND circuit 117 for a suitable time interval. An input of this flip-flop is connected to the lead 147A (FIG. 5).

The output of AND circuit 117 consequently sends a refresh command REFRA to the block A only if the counter 80 is not in the reset state and can be decremented. Such a recharge command is shown in FIG. 4. The output of the AND circuit 117 is also connected to the inverting input of the univibrator 118. Therefore, the falling edge of the REFRA signal, (which occurs at the end of the recharge operation on the block A), activates the univibrator 118 that generates at its output a command pulse INCRA. Such a pulse is applied, as already seen, to the input of the counter 64A and it increments by one unit the contents thereof, prearranging them to the recharge address to be used in the subsequent recharge operation. Similarly the output of the circuit OR 99 is connected to the inputs J and $\overline{K}$ of the flip-flop 119, that is activated by the START pulse and reset by the pulse T3.

The direct output of the flip-flop 119 is connected to an input of the AND gate 120, another input of which is connected to lead 147B. The output of the AND circuit 120 sends a command REFR B, the falling edge of which is used to activate the univibrator 121. The latter, in turn, generates the incrementing pulse INCR B of the counter 46B.

Having thus described the structure of the memory and of the control logic related to the refreshing opera- tions, the operation of such logic will now be considered.

At the start of the operation, powering on the central processor unit and the memory, all the registers, the flip-flop and the counters are reset and the oscillator 50 begins to operate. Assuming that no read-write or refreshing operation takes place, the operation of the logic circuitry is as follows:

Twelve μsec after the start, pulse CLOAP is generated. This pulse does not modify the state of flip-flop 115 since the output of the OR circuit 114 is at logic level "0."

After other 4 μsec., (that is 16 μsec. after the start), pulse CLUPO is generated. Since the counter 80 was in the configuration 0000, it is incremented by one unit and changes to the configuration 0001. The same happens for counter 81. However, flip-flop 90 remains in the reset state since the output of the OR circuit 111 was at logic level "0." Flip-flop 96 also remains in reset state since flip-flop 90 was and remains in the reset state.

After another 12 μsec, (i.e., 28 μsec. from the start), a new pulse CLOAP is generated which, as before, has no effect.

Four μsec. later, (that is 32 μsec. from the start), a new pulse CLUPO is generated which increments by another unit the contents of counters 80 and 81, thus changing them to the configuration 0010.

Having defined as "cycle" the interval of 16 μsec. existing between two subsequent CLUPO pulses, it is clear that after 4 cycles, the counters 80 and 81 will reach the configuration 0100. At this point additional incrementing of the two counters is inhibited. The output of OR circuit 111 goes to logic level "1."

At the end of the fourth cycle, the falling edge of the pulse CLUPO applied to the flip-flop 90, puts the latter in set state. Therefore, a low priority level interrupt request L PINT is generated and the decrementing input of the two counters 80 and 81 is inhibited. At the same time the flip-flop 91 is set. The pulses CLOAP still continue without effect at this point.

Assuming that the interrupt request is not honored by the central processor unit within the occurrence of the subsequent CLUPO pulse, that is within the end of the fifth cycle, the flip-flop 90 is kept in the set state and the flip-flop 96 is put in the set state. Therefore, the signal PRIM is generated while the signal $\overline{PRIM}$ declines to zero. The falling edge of $\overline{PRIM}$ activates the univibrator 95 and causes incrementing of the two counters 80 and 81 which then assume the configuration 0101.

Assuming that subsequently the interrupt request is not honored, i.e. does not become effective, within 12 μsec., the occurrence of the pulse CLOAP sets the flip-flop 115 and generates the high priority level interrupt signal HP INT. The central processor unit honors such an interrupt request almost immediately, i.e. it acts on it in the machine cycle subsequent to that in which the interrupt request occured, or within a predetermined number of cycles if so arranged.

Within a reduced time interval and in any case within less than 4 μsec, a REFR command and a START command are sent to the memory. These signals cause resetting of flip-flops 115 and, accordingly, the interrupt requests fall to logic level "0." In addition, through the addressing logic (FIG. 5) and the auxiliary circuits shown in FIG. 7, they generate the commands REFR A and REFR B, which cause the refreshing operation. By acting on the internal clock (FIG. 6), they cause the generation of the CLDA and CLDB pulses. However, these pulses do not cause decrementing of the counters 80 and 81, since the two AND circuits 88 and 98 are inhibited by the absence of the signal $\overline{BLCD}$.

Gates 88 and 98 are again enabled by the falling edge of the pulses CLDA and CLDB and the resultant resetting of flip-flop 91. The pulses CLDA and CLDB also reset the flip-flop 96.

At the conclusion of the refreshing operation, which is completed in one machine cycle, i.e. within 2 μsec, a pulse T3 from the timing network 45 (FIG. 5) resets flip-flops 116 and 119, resulting in the activation of the univibrators 118 and 121 and the generation of the pulses INCR A and INCR B. These pulses increment by one unit the addressing counters 46A and 46B, which are dedicated, thus setting them for a new refreshing operation.

The two counters 80 and 81 remain in the 0101 configuration. Therefore, at the end of the sixth cycle, when the pulse CLUPO occurs, it does not modify the contents of the two counters 80 and 81, the AND gates 93 and 107 being inhibited by the output configuration of the counters. Instead, the CLUPO pulse sets flip-flop 90 and generates a new low priority level interrupt request LPINT.

If the request is not honored within the seventh cycle, the pulse CLUPO which occurs at the end of this cycle sets flip-flop 96. As a result, univibrator 95 is activated such that the two counters 80 and 81 are incremented by one unit and assume the configuration 0110.

Assuming further that within the first 12 μsec of the eighth cycle the low priority interrupt request is not honored, the pulse CLOAP will set flip-flop 114 to generate a high priority level interrupt request HPINT. This interrupt is necessarily honored but, as already explained, the refreshing operation which follows does not modify the contents of the counters 80 and 81.

Therefore, at the end of the eighth cycle a new low priority level interrupt request is generated. If this request is not honored within the ninth cycle, the new CLUPO pulse which occurs at the end of the ninth cycle causes the flip-flop 96 to set and to activate the univibrator 95. Accordingly, the counters 80 and 81 are incremented and assume the configuration 0111. Again, if the interrupt request fails to become effective within the subsequent 12 μsec, the pulse CLOAP sets the flip-flop 115 and a high priority level interrupt request is generated. The latter request is necessarily honored within the 10th cycle, at the end of which a new low priority level interrupt request is generated. If the request is not honored within the 11th cycle, at the end of this cycle the pulse CLUPO sets the flip-flop 96, activates the univibrator 95, puts the flip-flop 115 in the set state and increments the content of the counters 80 and 81, which assume the configuration 1000.

If the request is not honored in the first 12 μsec of the twelfth cycle, a high priority level interrupt request is generated which is necessarily honored within the 12th cycle and which does not modify the contents of the counters 80 and 81. At the end of this cycle a new low priority level interrupt request is generated.

However, at this point the contents of the counters read 1000. Therefore, if this request is not honored within the first 12 μsec of the 13th cycle, the pulse CLOAP sets the flip-flop 115 since the output of OR circuit 114 is at logic level 1. As a consequence, a high priority level interrupt request is generated which is necessarily honored within the end of the 13th cycle and which does not modify the contents of the counters.

Again, at the end of the 13th cycle a low priority level interrupt request is generated and if this is not honored within the subsequent 12 μsec, a high priority level interrupt request is generated. In fact, the contents of the counter have not been modified. Taking into consideration the number of cycles elapsed and the number of refreshing operations carried out in the example given above, (which represents a worst case condition), it will be seen that the central processor units honors only the high priority level interrupt requests.

The operation of the refreshing control network can thus be summarized as follows:

(1) The control network does not generate any refreshing request if the delay accumulated in the refreshing is smaller than 4 cycles.
(2) It generates a low priority level interrupt signal when the delay accumulated reaches or exceeds 4 cycles.
(3) It generates a high priority level interrupt signal if the low priority interrupt requests are not honored within 28 μ sec.
(4) In any case, it generates a high priority interrupt signal when the accumulated delay reaches 8 cycles (plus 12 μsec which represents the delay of the pulse CLOAP with respect to the cycle end).

However, it is clear that for any configuration assumed by the counters 80 and 81, in the time intervals in which there is no refreshing interrupt request pending (both low and high priority), a read-write operation on a memory block causes a refreshing operation on the other block and consequently decrementing of the content of the counter relative to said block. Therefore, it follows that if in a time interval of 64 μsec there occur at least four read-write operations on block (A) and four read-write operations on block (B), the refreshing operations which follow maintain the counter configuration in a state that does not give rise to refreshing interrupt requests.

For a data processing system with a machine cycle of the order of one microsecond, the probability that read-write operations will occur with a frequency higher than that indicated is sufficiently high that in reality the refreshing operations are superimposed on the read-write operations. Only in exceptional cases will interrupt requests occur, for instance, when the central processor unit is busy with the execution of internal computations.

It should also be noted that while in the description above it was assumed that counters 80 and 81 were in the same configuration, in reality the two counters could assume different configurations. In such a case, the counter which controls the generation of the interrupt requests is the one with the heavier configuration. In order to obtain maximum efficiency of the system, the two memory blocks include respectively all the memory positions having an even address and all the memory positions having an odd address.

Since by fetching the information from memory or by writing information into memory, the order followed is primarily sequential, on average, the refreshing operations of block A will be equal to those of block B in the short term as well.

For the preferred embodiment described herein, it is noteworthy to consider the case where the two counters 80 and 81 are set in the configuration 0011 at the time in which the memory starts to operate and through the use of the preset input terminals. In such a case, if during the first cycle no refreshing operation takes place, at the end of said cycle a low priority level interrupt signal is generated. On the other hand, if during the first cycle some refreshing operation is carred out, the configuration 0011 is decremented accordingly.

In other words, the counters 80 and 81 will contain the most recent history of the refreshing operations and they will state a correlation between the number of refreshing operations carried out and the number of cycles elapsed. If the number of refreshing operations is higher than the number of cycles elapsed, the counters memorize the excess up to a maximum of 4 and inhibit the generation of recharge signals until said excess is reabsorbed.

When this excess is reabsorbed, every 16 μsec low priority level interrupt requests are generated. If the latter are not honored, i.e. do not become effective, within a pre-established time interval, (in the example described 28 μsec), a high priority level interrupt request is generated.

While the recharge system described is directed to a preferred embodiment of the invention, it will be apparent that modifications, changes and departures will now occur to those skilled in the art without departing from the principles and the spirit of the present invention.

For example, the allowed margin on the delay before an interrupt request is generated may vary as to number of cycles and the cycles may themselves have a duration longer or shorter than that set forth above.

Similarly, the criteria followed to cause the generation of high priority level interrupt signals may be modified. In addition, instead of inhibiting the refreshing operations following read-write operations, which could be carried out when interrupt requests are pending, it is possible to perform these operations and to cancel the interrupt requests emitted if the central processor unit allows this kind of procedure. Further, it is possible to manage the refreshing operations of the two blocks due to an interrupt request independently, for instance by splitting some circuit element such as the flip-flop 91, 96 and the univibrator 95, or modifying the circuit in other ways well known to those skilled in the art.

None of these possible variants, such as the substitution of circuit elements with others equivalent from a functional point of view, depart from the principles and the spirit of the invention, the scope of which is intended to be limited only by the appended claims.

What is claimed is:

1. A rechargeable memory comprising a plurality of individually addressable storage positions organized into rows and columns; said memory being organized into a pair of blocks each including a plurality of said rows; first circuit means for addressing a selected storage position to perform a read-write operation therein; second circuit means for sequentially addressing said rows of storage positions in a first one of said pair of blocks; third circuit means for sequentially addressing said rows of storage positions in the second one of said pair of blocks; first control means for performing a refresh operation in one of said pair of blocks on a row of storage positions selected by the corresponding one of said second or third circuit means and for simultaneously performing a read-write operation in the other one of said pair of blocks in a storage position selected by said first circuit means; timing means adapted to define periodic timing cycles; a reversible counter register corresponding to each of said pair of blocks adapted to provide an information signal representative of the difference between the number of elapsed cycles and the number of refresh operations carried out in each block during said elapsed cycles; and second control means for generating a first type of refresh interrupt signal when said information signal in at least one of said registers reaches a first predetermined value.

2. A memory as recited in claim 1 and further comprising third control means for generating a second type of refresh interrupt signal when said first interrupt signal fails to become effective within a predetermined time interval.

3. A memory as recited in claim 1 and further comprising third control means for generating a second type of refresh interrupt signal when said information signal in at least one of said registers reaches a second predetermined value.

4. A rechargeable memory comprising a plurality of individually addressable storage positions organized into rows and columns; said memory being organized into a pair of blocks each including a plurality of said rows; first circuit means for addressing a selected storage position to perform a read-write operation therein; second circuit means for sequentially addressing said rows of storage positions in a first one of said pair of blocks; third circuit means for sequentially addressing said rows of storage positions in the second one of said pair of blocks; first control means for performing a refresh operation in one of said pair of blocks on a row of storage positions selected by the corresponding one of said second or third circuit means and for simultaneously performing a read-write operation in the other one of said pair of blocks in a storage position selected by said first circuit means; timing means adapted to define periodic timing cycles; a reversible counter register for each of said blocks adapted to provide a first or a second signal representative of the number of recharging operations performed on each block during said cycles or of the absence thereof, respectively with respect to the number of said cycles; and second control means adapted to generate a refresh interrupt signal having a first priority level when said second signal reaches a first predetermined value.

5. A memory as recited in claim 4 and further comprising third control means adapted to generate a refresh interrupt signal having a second priority level when said second signal reaches a second predetermined value.

6. A rechargeable dynamic semiconductor memory comprising a plurality of individually addressable storage positions organized into rows and columns; said memory being organized into first and second blocks each including a plurality of said rows of addressable storage positions; first circuit means for addressing a selected storage position to perform a read-write operation therein; second and third circuit means for sequentially addressing the rows of storage positions of said first and second blocks respectively; first control means for performing a refresh operation in one of said blocks on a row of storage positions selected by the corresponding one of said second or third circuit means and for simultaneously performing a read-write operation in the other one of said blocks in a storage position selected by said first circuit means; timing means adapted to generate periodic signals representative of timing cycles; a reversible counter register corresponding to each of said blocks adapted to provide an information signal relative to the difference between the number of elapsed cycles and the number of refresh operations carried on in each block during said elapsed cycles; and second control means for providing a refresh interrupt signal having a first priority level when said information signal in at least one of said registers reaches a first pretermined value.

7. A memory as recited in claim 6 and further comprising third control means for providing a refresh interrupt signal having a higher priority level than said first level, said third control means being effective to generate said last recited interrupt signal when said information signal in at least one of said registers reaches a second predetermined value, or when said first interrupt signal fails to become effective within a predetermined time interval.

* * * * *

UNITED STATES PATENT OFFICE
CERTIFICATE OF CORRECTION

Patent No. 4,106,108          Dated August 8, 1978

Inventor(s) Ezio Cislaghi, Alessandro Scotti, Renzo Pederzini

It is certified that error appears in the above-identified patent and that said Letters Patent are hereby corrected as shown below:

Column 5, line 7, "manufactures" should read --manufacturers--.

Column 5, line 57, "$CE_{1b}$" should read -- $CE_{16}$ --.

Column 8, line 50, "later" should read -- latter --.

Column 8, line 53, --) -- should be inserted after "instant".

Column 9, line 53, "OLDA" should read -- CLDA --.

Column 10, line 6, "by" should read -- or --.

Column 10, line 18 "(a)" should read -- (1) --.

Column 12, line 35, "K" should read -- $\overline{K}$ -- .

Column 13, line 13, "other" should read -- another --.

Column 13, line 57, "occured" should read -- occurred -- .

Column 14, line 65, "level 1" should read -- level "1" -- .

Column 15, line 22, "$\mu$ sec." should read -- $\mu$sec. -- .

Signed and Sealed this

Thirteenth Day of February 1979

[SEAL]

Attest:

RUTH C. MASON
*Attesting Officer*

DONALD W. BANNER
*Commissioner of Patents and Trademarks*